(12) United States Patent
Koizumi

(10) Patent No.: US 11,705,347 B2
(45) Date of Patent: Jul. 18, 2023

(54) THERMAL REGULATOR, SUBSTRATE PROCESSING APPARATUS, AND METHOD OF CONTROLLING TEMPERATURE OF STAGE

(71) Applicant: Tokyo Electron Limited, Tokyo (JP)

(72) Inventor: Katsuyuki Koizumi, Kurokawa-gun Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 324 days.

(21) Appl. No.: 16/892,945

(22) Filed: Jun. 4, 2020

(65) Prior Publication Data

US 2020/0388514 A1 Dec. 10, 2020

(30) Foreign Application Priority Data

Jun. 7, 2019 (JP) ................. 2019-107426

(51) Int. Cl.
*H01L 21/683* (2006.01)
*H01L 21/67* (2006.01)
*H01L 21/687* (2006.01)

(52) U.S. Cl.
CPC .. *H01L 21/67098* (2013.01); *H01L 21/67248* (2013.01); *H01L 21/68714* (2013.01)

(58) Field of Classification Search
CPC .................... H01L 21/67103; H01L 21/67248
See application file for complete search history.

(56) References Cited

U.S. PATENT DOCUMENTS

| | | | | |
|---|---|---|---|---|
| 10,332,772 B2 * | 6/2019 | Tantiwong | .......... | H01L 21/6833 |
| 10,483,136 B2 * | 11/2019 | Uemura | ................. | H05B 3/283 |
| 10,553,411 B2 * | 2/2020 | Chen | ................. | H01J 37/32935 |
| 10,699,883 B2 * | 6/2020 | Teruuchi | ................. | H05B 3/62 |
| 11,121,009 B2 * | 9/2021 | Kitagawa | .......... | H01L 21/67069 |
| 2013/0105465 A1 * | 5/2013 | Swanson | ............. | H05B 1/0227 219/508 |
| 2020/0227236 A1 * | 7/2020 | Saito | .................... | H01J 37/3211 |

FOREIGN PATENT DOCUMENTS

| | | | | |
|---|---|---|---|---|
| JP | 5239988 B2 * | 7/2013 | ......... | C23C 16/4586 |
| JP | 2018125335 A | 8/2018 | | |

* cited by examiner

*Primary Examiner* — Gregory A Wilson
(74) *Attorney, Agent, or Firm* — Nath, Goldberg & Meyer; Jerald L. Meyer; Tanya E. Harkins

(57) ABSTRACT

A thermal regulator for controlling temperature of a substantially circular stage comprising a plurality of first segments and a plurality of second segments in a radial direction and in a circumferential direction, each of the first segments and at least two adjacent second segments defining a set of segments, the thermal regulator includes heaters disposed in the first and second segments, respectively, thermal sensors disposed in the first segments, respectively, a controller configured to control the heaters in response to temperatures determined by the thermal sensors, and a segment switch to switch the second segments to be controlled in conjunction with the first segment in each set of segments.

11 Claims, 10 Drawing Sheets

THERMAL REGULATOR, SUBSTRATE PROCESSING APPARATUS, AND METHOD OF CONTROLLING TEMPERATURE OF STAGE

CROSS-REFERENCE TO RELATED APPLICATION

This application is based upon and claims the benefit of priority from Japanese Patent Application No. 2019-107426, filed on Jun. 7, 2019, the entire contents of which are incorporated herein by reference.

TECHNICAL FIELD

The present disclosure relates to a thermal regulator, a substrate processing apparatus, and a method of controlling a temperature of a stage.

BACKGROUND

For example, Patent Document 1 discloses a stage in which a heating plate forming a wafer stage is divided into a plurality of regions. In addition, Patent Document 1 discloses that a temperature sensor for a heater is provided in each divided region of the heating plate of the stage.

PRIOR ART DOCUMENT

Patent Document

Patent Document 1: Japanese Laid-Open Patent Publication No. 2018-125335

SUMMARY

According to embodiments of the present disclosure, there is provided a thermal regulator for controlling temperature of a substantially circular stage comprising a plurality of first segments and a plurality of second segments in a radial direction and in a circumferential direction, each of the first segments and at least two adjacent second segments defining a set of segments, the thermal regulator including: heaters disposed in the first and second segments, respectively; thermal sensors disposed in the first segments, respectively; a controller configured to control the heaters in response to temperatures determined by the thermal sensors; and a segment switch to switch the second segments to be controlled in conjunction with the first segment in each set of segments.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
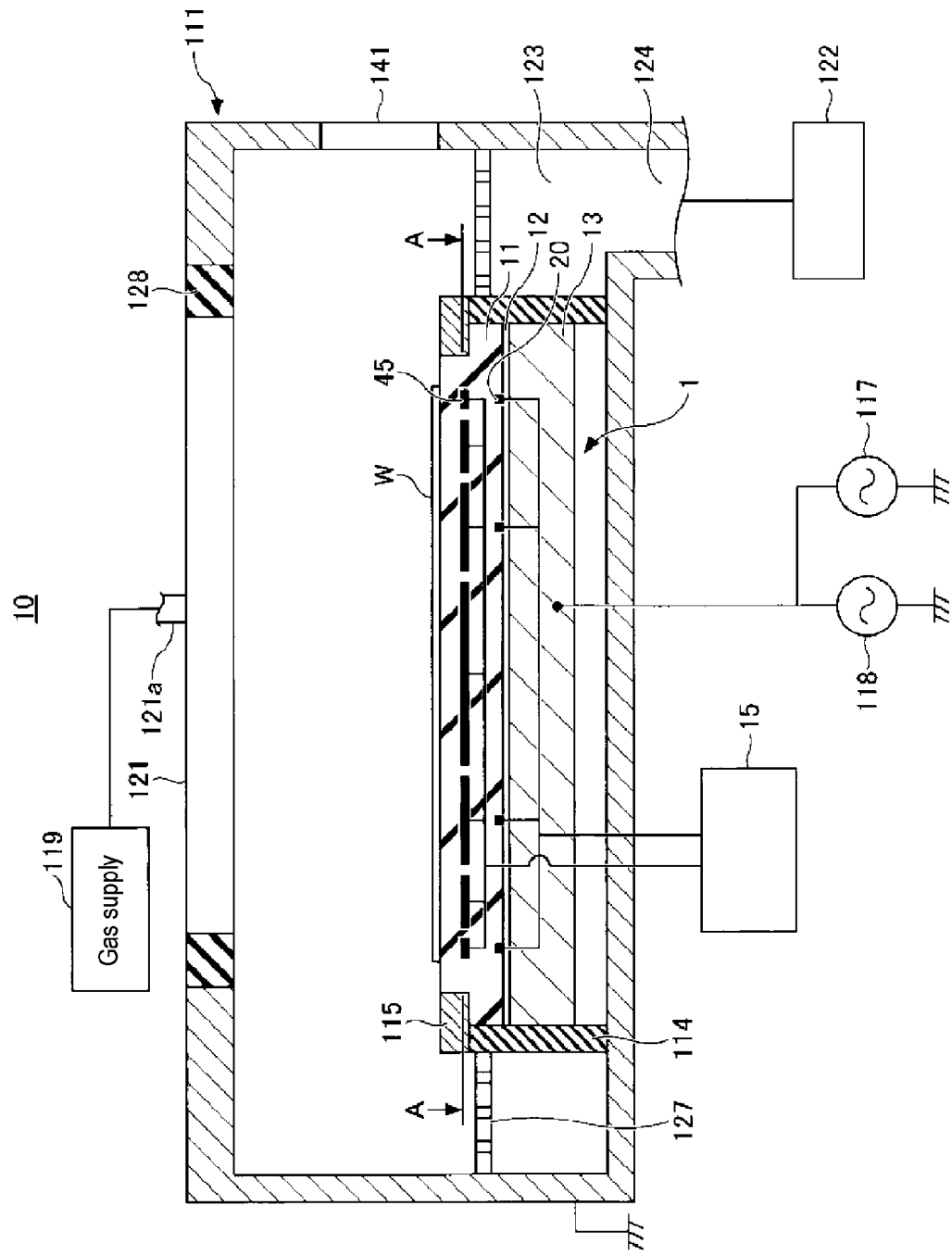
FIG. 1 is a view illustrating an overall configuration of a substrate processing apparatus having a stage according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

First Embodiment

<<Overall Configuration of Substrate Processing Apparatus>>

FIG. 1 is a view illustrating an overall configuration of a substrate processing apparatus having a stage according to a first embodiment of the present disclosure. A stage 1 according to the present embodiment is a stage configured to place and hold a substrate W thereon in a plasma processing apparatus or the like for performing, for example, plasma processing.

The substrate processing apparatus 10 includes a processing chamber 111 and a stage 1 disposed inside the processing chamber 111. The processing chamber 111 is grounded. The stage 1 includes an electrostatic chuck (ESC) 11, an adhesive layer 12, and a base 13. The base 13 supports the electrostatic chuck 11. The electrostatic chuck 11 and the base 13 are bonded to each other by the adhesive layer 12. The stage 1 is disposed at the bottom of the processing chamber 111 via a support 114 of an insulating member.

The base 13 is made of aluminum or the like. The electrostatic chuck 11 is made of a dielectric material such as alumina ($Al_2O_3$) or the like. The electrostatic chuck 11 has a substantially circular shape in a top view. The electrostatic chuck 11 holds the substrate W by an electrostatic attraction force generated by applying a DC voltage to an electrode (not illustrated).

The electrostatic chuck 11 includes a plurality of thermistors 20. The thermistors 20 are elements that measure the temperature inside the electrostatic chuck 11. The thermistors 20 are provided in portions of a segment Seg of the stage 1 (the electrostatic chuck 11) (see FIG. 2). The thermistor 20 is a general term for the thermistors 20a, 20b, . . . , which will be described later (see FIG. 4).

In addition, the electrostatic chuck 11 includes a heater 45. The heater 45 controls the temperature of the substrate W by heating the electrostatic chuck 11. The heater 45 is embedded inside the electrostatic chuck 11. The heater 45 is divided into a plurality of heaters. Each heater 45 is provided in each of individual segments divided in the segment Seg. Each heater 45 may operate independently. The heater 45 is a general term for heaters 45a, 45b, 45c . . . , which will be described later (see FIG. 4).

The substrate W is placed at the center of the electrostatic chuck 11, and an annular edge ring 115 (also referred to as a "focus ring") that surrounds the periphery of the substrate W at the outer periphery of the electrostatic chuck 11 is placed.

An annular exhaust passage 123 is formed between the side wall of the processing chamber 111 and the side wall of the stage 1, and is connected to the exhaust apparatus 122 via an exhaust port 124. The exhaust apparatus 122 is configured with a vacuum pump and exhausts the gas in the processing chamber 111 to reduce a pressure of the processing space in the processing chamber 111 to a predetermined vacuum degree.

The exhaust passage 123 is provided with a baffle plate 127 that separates the processing space from the exhaust space and controls the flow of the gas. The stage 1 is connected to a first high-frequency power supply 117 and a second high-frequency power supply 118. The first high-frequency power supply 117 applies, for example, high-frequency power HF for plasma generation of 60 MHz to the stage 1, for example. The second high-frequency power supply 118 applies, for example, high-frequency power LF for ion attraction of 40 MHz to the stage 1.

A showerhead 121 is provided in an opening of the ceiling of the processing chamber 111 via a ring-shaped insulating member 128 on the outer periphery thereof. A gas supply 119 supplies a gas according to process conditions. The gas enters the showerhead 121 through a gas pipe 121a and is introduced into the processing chamber 111 in a shower form. The high-frequency power HF is capacitively applied between the stage 1 and the showerhead 121, and plasma is generated from the gas by the high-frequency power HF.

Figure 2:
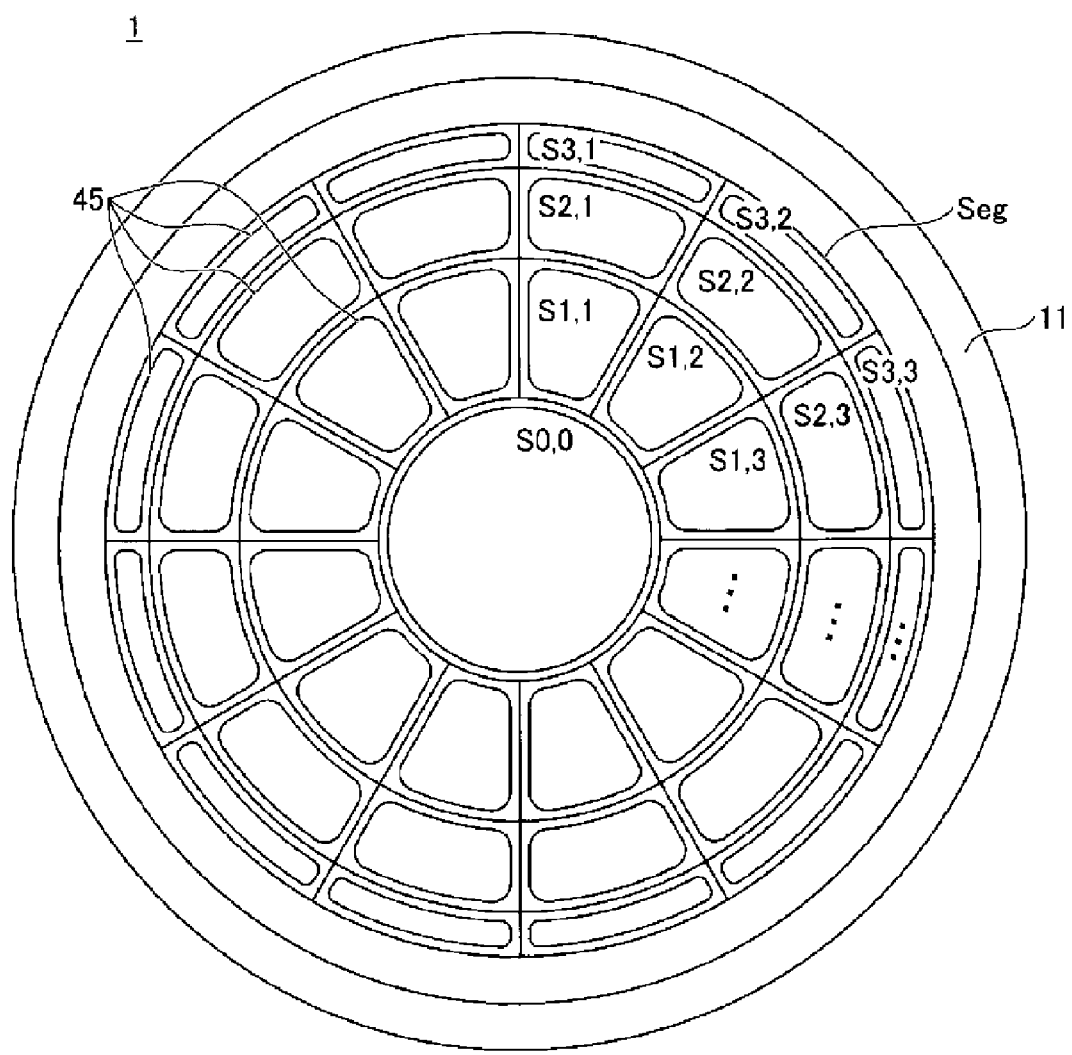
FIG. 2 is a view illustrating a definition of segments of the stage according to the first embodiment of the present disclosure.

Here, the segments of the stage 1 will be described. FIG. 2 is a diagram illustrating a definition of the segments of the stage 1 according to a first embodiment of the present disclosure. FIG. 2 is a view illustrating a cross section taken along line A-A in the electrostatic chuck 11 of FIG. 1. A plurality of heaters 45 are embedded in the electrostatic chuck 11 of the stage 1. The plurality of heaters 45 are divided and arranged in a segment Seg. The outer diameter of the segment Seg has a circular shape that has substantially the same diameter as the outer diameter of the substrate W to be placed. The segment Seg includes a plurality of individual segments. There is one individual segment in the center of the circle. In the example of FIG. 2, the stage 1 of the present embodiment is divided into three individual segments in the radial direction and 12 individual segments in the circumferential direction outside the central individual segment. Therefore, the stage 1 of the present embodiment includes 37 individual segments (1+3×12=37). Further, the radial lengths of the individual segments become shorter towards the outer side. However, the arrangement and the number of the individual segments in the segment Seg are not limited thereto, and it is only necessary that at least two or more individual segments are provided in each of the radial direction and the circumferential direction. In the example of FIG. 2, one individual segment is provided in the center portion of the circle, but the individual segment in the center portion may also be divided in the circumferential direction.

Here, the format showing the position of each individual segment in the segment Seg will be described. The position of each individual segment is represented by the format Sa,b. Here, "a" represents a position in the radial direction. Specifically, "a" has a value that increases along with an increase of the distance from the center in the radial direction, where the individual segment at the center has zero value. Further, "b" represents a position in the circumferential direction. Specifically, "b" has a value that increases as the position advances in the circumferential direction (clockwise in FIG. 2) with the reference circumferential position (right side just above the center in FIG. 2) as 1. In addition, b is 0 for the central individual segment.

Although not illustrated in FIG. 2, thermistors 20 are provided in some of the plurality of individual segments and are not provided in one-to-one correspondence with all of the plurality of individual segments. Therefore, the number of thermistors 20 is smaller than the number of individual segments included in the segment Seg.

The heaters 45 are provided in a one-to-one relationship with all of the plurality of individual segments. That is, the number of heaters 45 is the same as the number of individual segments included in the segment Seg.

Returning back to FIG. 1, the substrate processing apparatus 10 has a controller 15. The controller 15 controls the entire substrate processing apparatus 10. In the following, among the controls of the substrate processing apparatus 10 performed by the controller 15, the temperature control of the stage 1 will be described. That is, hereinafter, the temperature control of the stage 1 performed by the controller 15 using the stage 1 and the controller 15 included in the substrate processing apparatus 10 as a thermal regulator will be described.

<<Operation of Thermal Regulator>>

Figure 3:
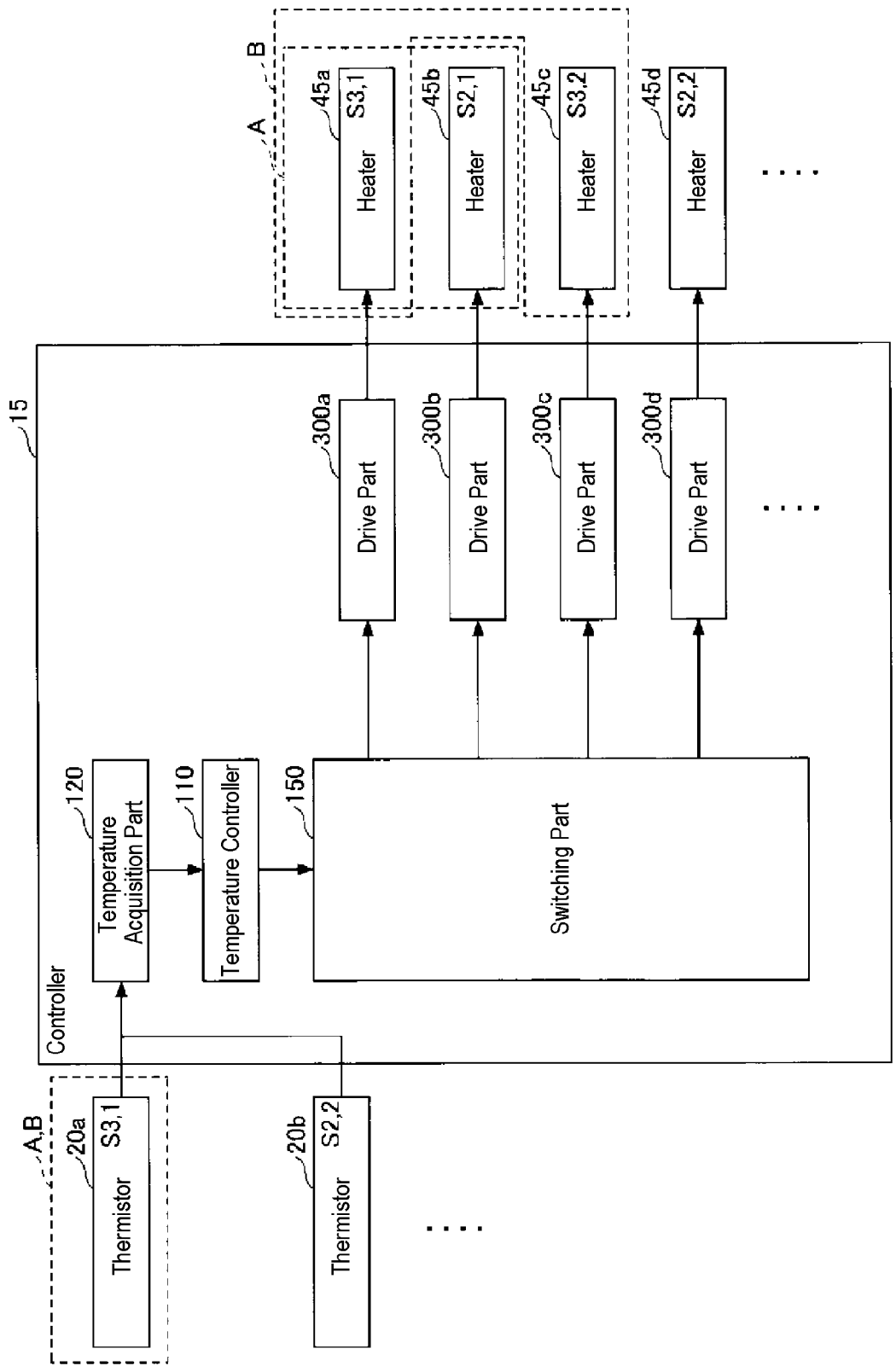
FIG. 3 is a view illustrating a configuration and operation of a thermal regulator according to the first embodiment of the present disclosure.
Figure 4:
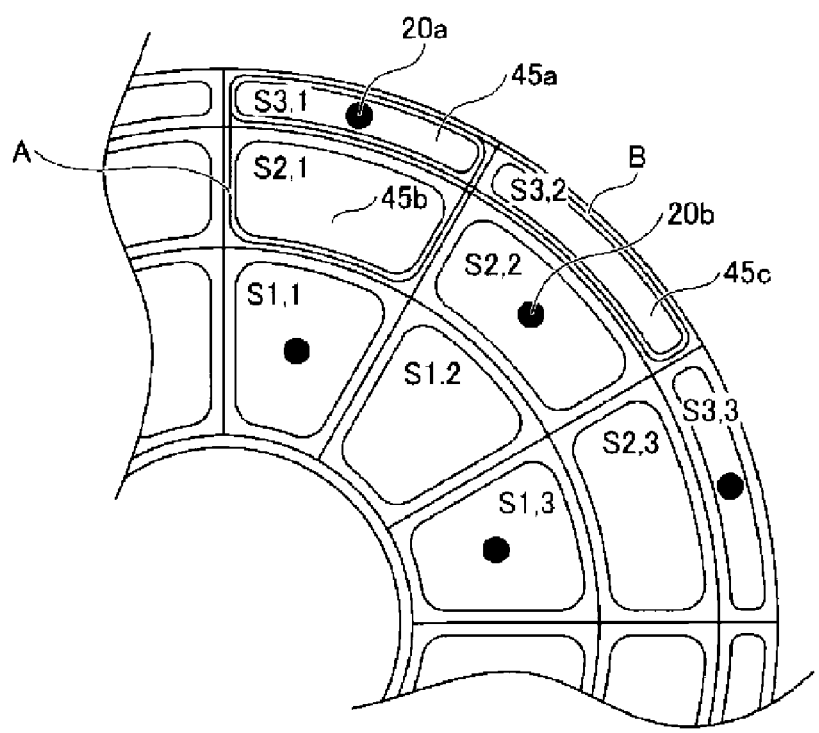
FIG. 4 is a view illustrating an exemplary temperature control state of segments of the stage according to the first embodiment of the present disclosure.

FIG. 3 is a view illustrating a configuration and operation of a thermal regulator according to the first embodiment of the present disclosure. FIG. 4 is a view illustrating an exemplary temperature control state of the segments in the stage 1 according to the first embodiment of the present disclosure.

The thermal regulator has a stage 1 and a controller 15. As illustrated in FIG. 3, the controller 15 is connected to a thermistor 20 and a heater 45 provided in the stage 1. FIG. 3 illustrates the thermistors 20a and 20b illustrated in FIG. 4, a plurality of heaters 45a, 45b, and 45c, and the controller 15. The thermistors 20a, 20b, . . . are examples of a thermal sensor that measures the temperature of the stage 1. The thermal sensor is not limited to the thermistors, and may be any temperature measurement device capable of detecting temperature. The heaters 45a, 45b, 45c . . . are examples of a plurality of heating parts that heat the stage 1. The heating parts are not limited to the heaters embedded in the stage 1, and may be sheet-shaped heaters attached to the stage 1.

The controller 15 controls the temperature of the stage 1. The controller 15 includes a temperature controller 110, a temperature acquisition part 120, a switching part 150, and a drive part 300. The temperature controller 110, the temperature acquisition part 120, and the switching part 150 may be realized by a field-programmable gate array (FPGA) or a central processing unit (CPU) that executes a program stored in a storage device or the like. The drive part 300 may be realized by, for example, a metal-oxide-semiconductor field-effect transistor (MOSFET). The drive part 300 is, for example, a drive circuit, and may not be included in the controller 15. The drive part 300 is a general term for the drive parts 300a, 300b, 300c, . . . .

The temperature acquisition part 120 acquires measurement values measured by the thermistors 20a, 20b, . . . . The temperature acquisition part 120 converts the acquired measurement values into measurement values and outputs the measurement values to the temperature controller 110. In addition, with respect to the conversion into measurement values in the temperature acquisition part 120, when digital signals are input from the thermistors 20a, 20b . . . , the digital values of the digital signals are converted into the measurement values, and when analog signals are input, analog-to-digital conversion is performed to covert the values of the analog signals into the measurement values.

The temperature controller 110 controls the temperature of the substrate W placed on the stage 1. The temperature controller 110 controls the drive part 300 such that the temperature of the substrate W becomes a desired temperature based on the converted measurement values. The temperature controller 110 receives the measurement values as an input from the temperature acquisition part 120 and outputs a control signal to the drive part 300. The temperature controller 110 feeds back, for example, the input measurement values to perform a PID control or the like.

The switching part 150 switches the output destination of the control signal from the temperature controller 110. The drive part 300 drives the corresponding heater 45.

As illustrated in FIG. 4, the thermistors 20a, 20b, . . . are not provided on all the individual segments of the stage 1, but are provided at predetermined positions. Specifically, the thermistors 20 are provided alternately in the circumferential direction and the radial direction. In addition, the thermistors 20 are alternately provided in the outermost individual segments and the inner individual segments. For example, the thermistor 20a is provided in the individual segment S3,1 and measures the temperature of the individual segment S3,1. Similarly, the thermistor 20b measures the temperature of the individual segment S2,2. No thermistor is provided in the individual segments S2,1 and S3,2. However, the positions of the thermistors 20 are not limited thereto, and the outermost individual segments and the inner individual segments may be provided so as to be displaced in the circumferential direction.

The drive part 300 drives the heater 45. In the example of FIG. 3, the drive parts 300a, 300b, 300c, and 300d output driving signals to respective heaters 45a, 45b, 45c, and 45d based on a control signal from the controller 15. The driving signals output from the drive part 300 are, for example, signals of a drive current, a drive voltage, or the like. One drive part 300 of this embodiment is provided for each heater 45. That is, the number of drive parts 300 are the same as the number of heaters 45. The heaters 45a, 45b, 45c, and 45d are driven by the drive parts 300a, 300b, 300c, and 300d, respectively. The drive parts 300 may be provided outside the controller 15.

The heaters 45 heat the electrostatic chuck 11 based on the control signal from the drive part 300. The heaters 45 are provided in respective individual segments. For example, the heater 45a is provided in the individual segment S3,1 and heats the electrostatic chuck 11 in the individual segment S3,1. Similarly, the heater 45b is provided in the individual segment S2,1 and the heater 45c is provided in the individual segment S3,2 so as to heat the electrostatic chuck 11 in the respective individual segments.

In the stage 1 of the present embodiment, the heaters 45 to be controlled in conjunction with the thermistor 20 are switched depending on the performance required for heating under the control of the controller 15.

A specific operation of the stage 1 of the first embodiment will be described with reference to FIG. 4.

The heater 45, which is controlled by the temperature controller 110 using the measurement value of the thermistor 20a of the outermost individual segment S3,1, will be described. The temperature controller 110 controls the temperature of the heater 45a of the individual segment S3,1 including the thermistor 20a using the measurement value of the thermistor 20a.

When heating the substrate W on the stage 1, the following two cases may be considered. (1) A case of controlling the temperature finely in the circumferential direction of the substrate W and coarsely in the radial direction, and (2) a case of controlling the temperature coarsely in the circumferential direction of the substrate W and finely in the radial direction. Each case will be described.

(1) Case of Controlling the Temperature Finely in the Circumferential Direction of the Substrate W and Coarsely in the Radial Direction When it is desired to control the temperature finely in the circumferential direction of the substrate W and coarsely in the radial direction when heating the substrate W on the stage 1, the heater 45a and the heater 45b in a segment set A in FIG. 4, specifically, in the individual segment S3,1 and the individual segment S2,1 are controlled using the measurement value of the thermistor 20a. More specifically, the switching part 150 switches the control signals, which are output by the temperature controller 110, based on the measurement value of the thermistor 20a, so as to be output to the drive part 300a and the drive part 300b. As a result, the heaters 45a and 45b are controlled by the drive part 300a and the drive part 300b such that the temperature of the substrate W becomes a temperature based on the measurement value of the thermistor 20a.

At this time, since the temperature control in the circumferential direction of the substrate W is performed with the same resolution as the individual segments divided in the circumferential direction, the temperature control in the circumferential direction of the substrate W is performed to be finer than that in the radial direction. By this control, when the substrate W is heated by the stage 1, the temperature can be controlled finely in the circumferential direction of the substrate W and coarsely in the radial direction.

(2) Case of Controlling the Temperature Coarsely in the Circumferential Direction of the Substrate W and Finely in the Radial Direction When it is desired to control the temperature coarsely in the circumferential direction of the substrate W and finely in the radial direction when heating the substrate W on the stage 1, the heater 45a and the heater 45c in a segment set B in FIG. 4, specifically, in the individual segment S3,1 and the individual segment S3,2, are controlled using the measurement value of the thermistor 20a. More specifically, the switching part 150 switches the control signals, which are output by the temperature controller 110, based on the measurement value of the thermistor 20a, so as to be output to the drive part 300a and the drive part 300c. As a result, the heaters 45a and 45c are controlled by the drive part 300a and the drive part 300c such that the temperature of the substrate W becomes a temperature based on the measurement value of the thermistor 20a.

At this time, since the temperature control in the radial direction of the substrate W is performed with the same resolution as the individual segments divided in the radial direction, the temperature control in the radial direction of the substrate W is performed to be finer than that in the circumferential direction. By such control, when the substrate W is heated by the stage 1, the temperature can be controlled coarsely in the circumferential direction of the substrate W and finely in the radial direction.

In the stage 1 of the present embodiment, switching is performed by the switching part 150 between the outermost individual segment S3,2 of the segment Seg adjacent to the individual segment S3,1, in which the thermistor 20a is disposed, and the inner individual segment S2,1 inside the individual segment S3,1.

In addition, in the stage 1 of the present embodiment, as described above, the controller 15 performs a control through a control method including a procedure of controlling the heater 45a provided with the thermistor 20a based on the measurement value of the thermistor 20a and controlling the heater 45b or the heater 45c in accordance with switching between the heater 45b and the heater 45c. In addition, the individual segment S3,1, in which the thermistor 20a is disposed, is an example of the first individual segment in which a thermal sensor is provided. The individual segment S3,2 adjacent to the individual segment S3,1 in the circumferential direction or the individual segment S2,1 adjacent in the radial direction is an example of a second individual segment, which is controlled in synchronization with the first individual segment. In addition, the phrase "controlled in synchronization" means that the second individual segment, which is not provided with a thermal sensor, is controlled based on the measurement value measured by the thermal sensor in the first individual segment, which is provided with the thermal sensor.

<<Action and Effect>>>

In the stage 1 of the present embodiment, the thermistor 20 of one individual segment provided at a predetermined position controls the heaters 45 of a plurality of individual segments. That is, the stage 1 includes a plurality of heaters 45 provided for respective individual segments obtained by dividing the segment Seg, and a plurality of thermistors 20, which are smaller in number than the individual segments and each of which is installed in any of the individual segments. The controller 15 controls a heater 45, which is installed in one individual segment provided with a thermistor 20 at a predetermined position, and a heater 45, which is installed in another individual segment in the same segment set controlled in synchronization with the one individual segment and is not provided with the thermistor 20, depending on the temperature detected by the thermistor 20. The switching part 150 of the controller 15 switches the second individual segment controlled in synchronization with the first individual segment.

As a result, it is possible to make the number of thermistors 20 and the like to be smaller than the number of heaters 45. Thus, it is possible to reduce the calculation load of the FPGA or the like that constitutes the controller 15. In addition, by collectively controlling a plurality of individual segments in the segment Seg of the stage 1, it is possible to reduce the thermistors, wiring lines, circuits in the board, and the like.

In the stage 1 of the present embodiment, the heaters 45 to be controlled may be switched by the switching part 150. For example, the stage 1 of the present embodiment may control the temperature finely in the circumferential direction of the substrate W and coarsely in the radial direction, or coarsely in the circumferential direction of the substrate W and finely in the radial direction. As a result, the number of models of the stage can be reduced, costs can be reduced, inventory management costs can be reduced, and a delivery period can be shortened.

Second Embodiment

Figure 5:
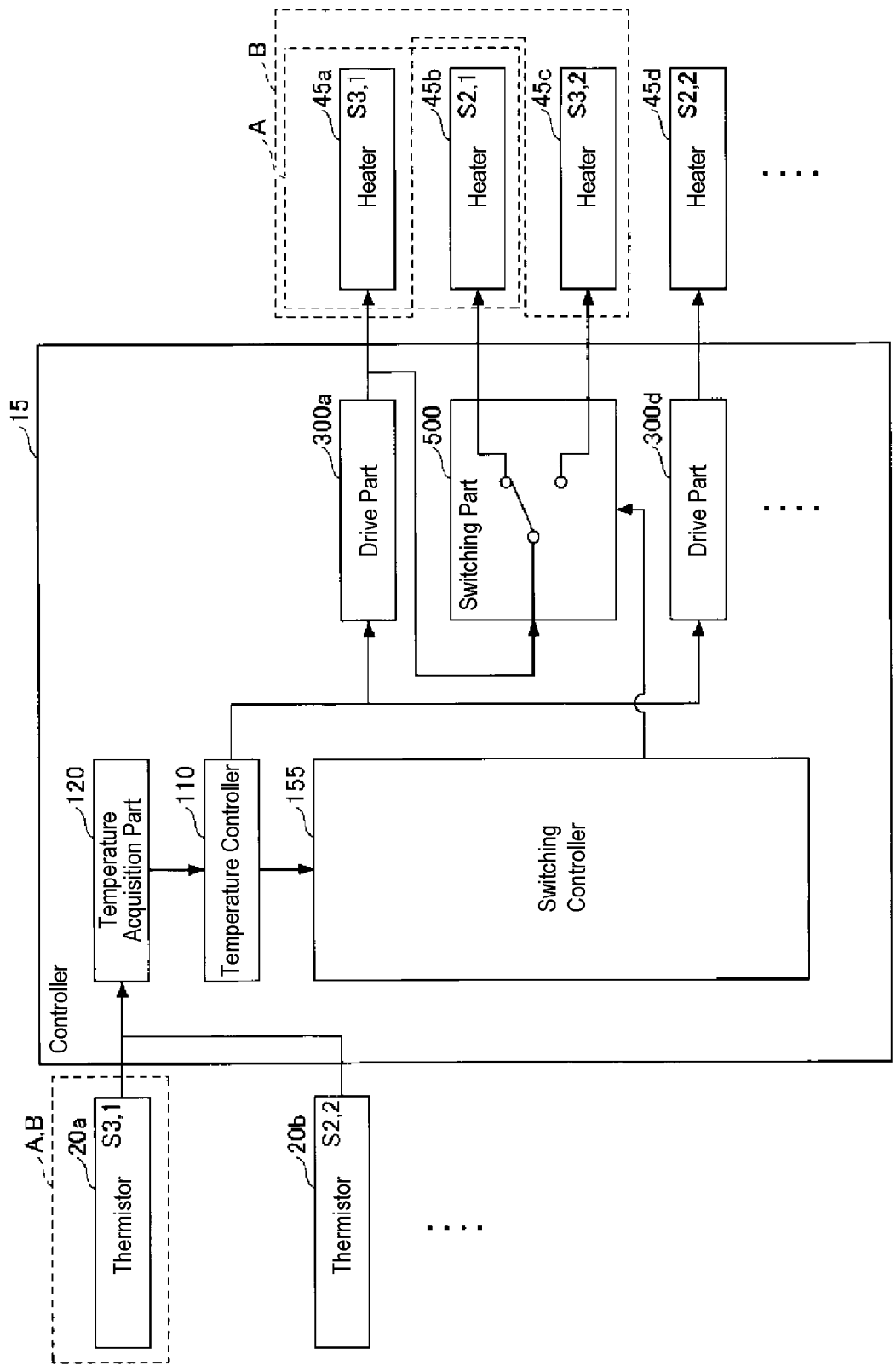
FIG. 5 is a view illustrating a configuration and operation of a thermal regulator according to a second embodiment of the present disclosure.

FIG. 5 is a view illustrating a configuration and operation of a thermal regulator according to a second embodiment of the present disclosure.

In a stage 2 according to the second embodiment, the switching between heaters 45 is performed by a switching part 500.

The switching part 500 switches a driving signal input from the drive part 300 to any of the plurality of heaters 45 based on a control signal from the switching controller 155. For example, in FIG. 5, the switching part 500 switches a driving signal output from the drive part 300a to the heater 45b or the heater 45c. By switching in this manner, the heaters 45 to be controlled in conjunction with the thermal sensor are switched.

In the stage 2 according to the second embodiment, it is possible to reduce the number of drive parts 300 with respect to the number of heaters 45. The drive part 300 and the switching part 500 may be provided outside the controller 15.

Third Embodiment

Figure 6:
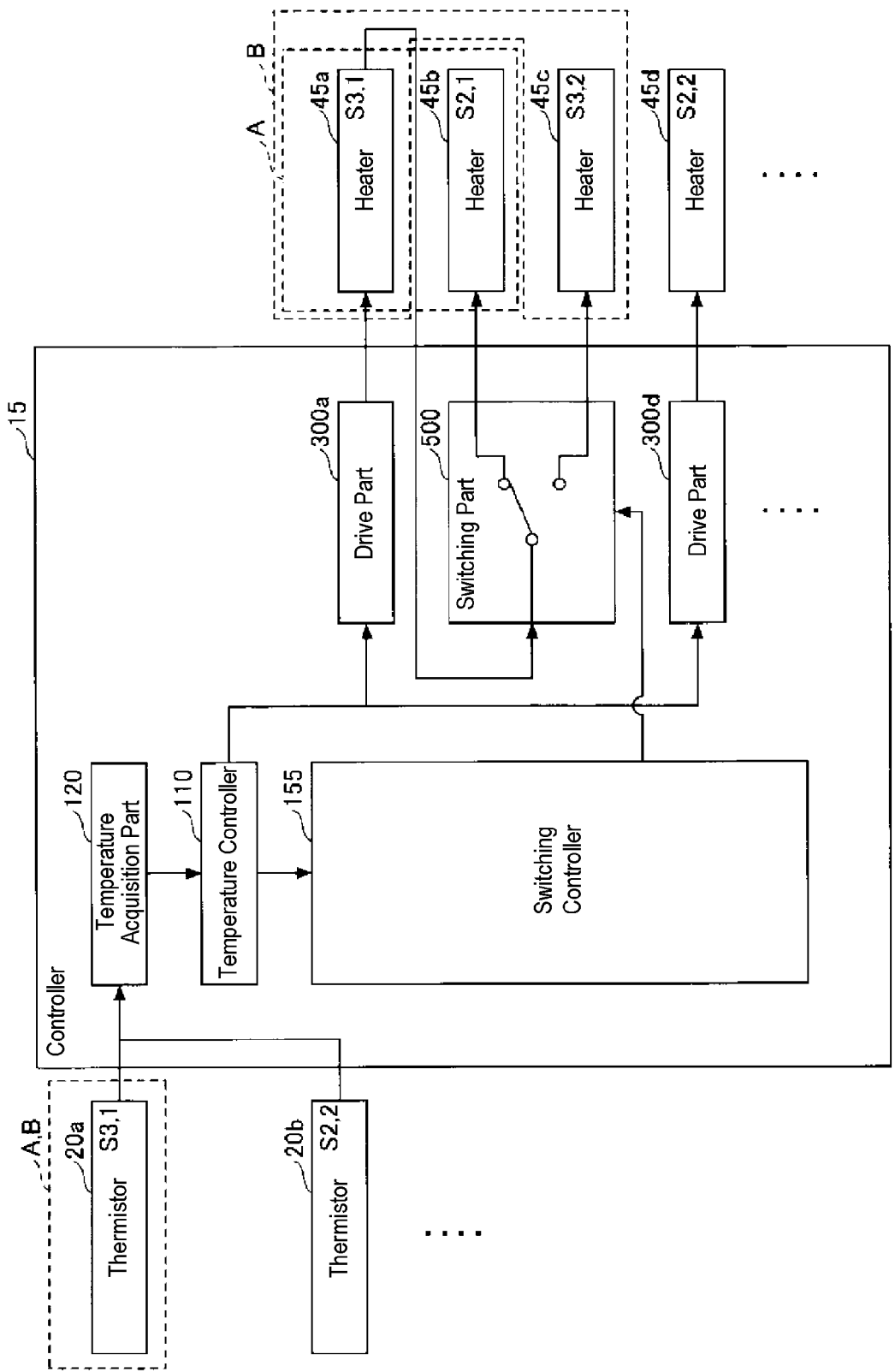
FIG. 6 is a view illustrating a configuration and operation of a thermal regulator according to a third embodiment of the present disclosure.

FIG. 6 is a view illustrating a configuration and operation of a thermal regulator according to a third embodiment of the present disclosure.

In the stage 3 according to the third embodiment, a plurality of heaters 45 are connected in series.

The switching part 500 switches a driving signal input from a heater 45 to any of the plurality of other heaters 45 based on a control signal from the switching controller 155. For example, in FIG. 6, the switching part 500 switches a driving signal output from the heater 45a to the heater 45b or the heater 45c. By switching in this manner, the heaters 45 to be controlled in conjunction with the thermal sensor are switched.

In the stage 3 according to the third embodiment, the resistance value can be increased by connecting the heaters 45 in series. Accordingly, the flowing current can be reduced. In addition, the drive part 300 and the switching part 500 may be provided outside the controller 15.

Fourth Embodiment

Figure 7:
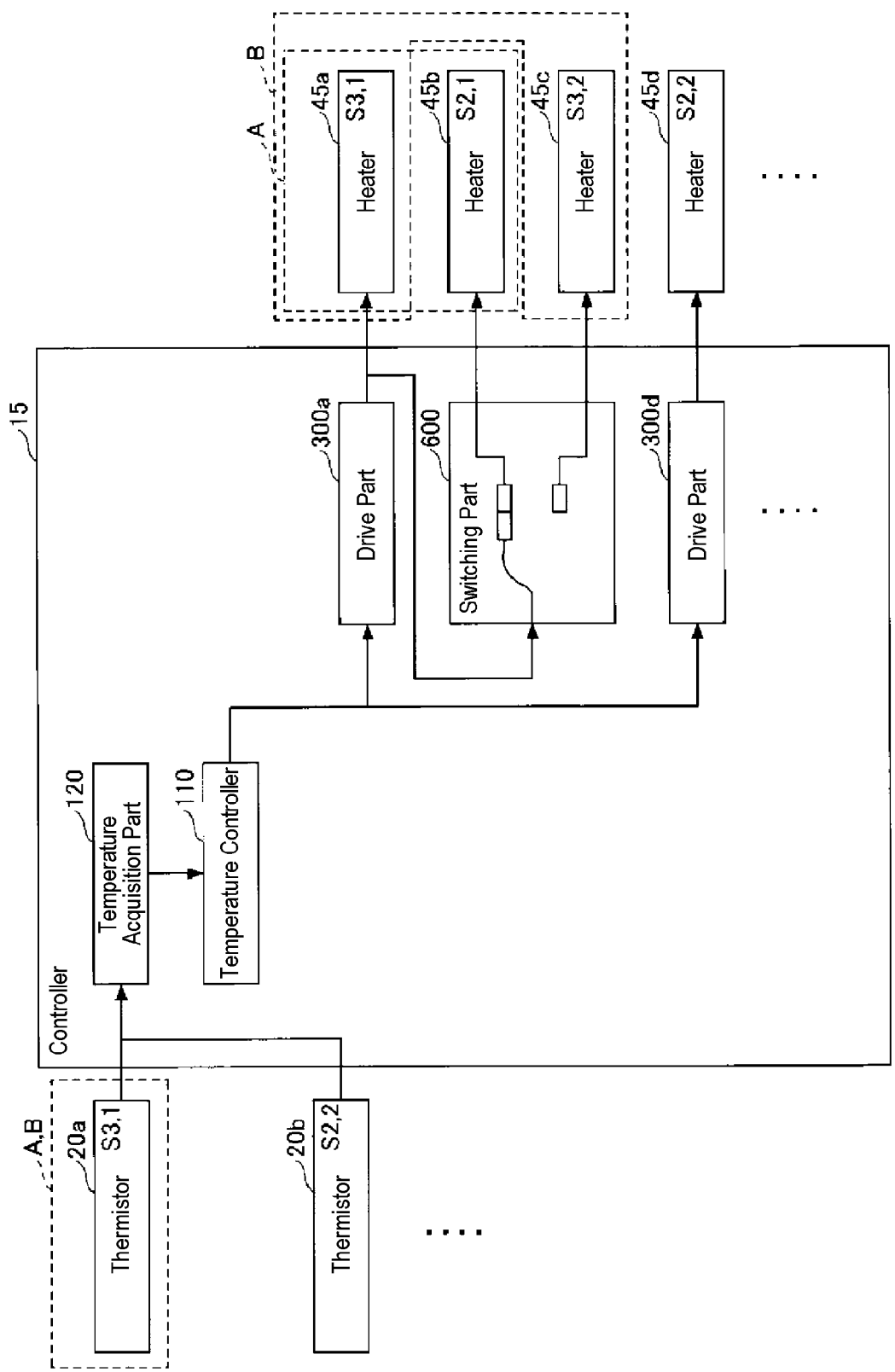
FIG. 7 is a view illustrating a configuration and operation of a thermal regulator according to a fourth embodiment of the present disclosure.

FIG. 7 is a view illustrating a configuration and operation of a thermal regulator according to a fourth embodiment of the present disclosure.

In a stage 4 according to the fourth embodiment, the switching between heaters 45 is performed by a switching part 600. Heaters, which are the heater 45, are connected to the control board by a connector at the switching part 600. The connection destination is changed by changing the connection destination of the connector or changing the pin assignment. In this manner, the switching part 600 switches the individual segments by reconnecting the wiring lines.

Since the controller 15 does not require a switching control, it is possible to reduce the scale of, for example, an FPGA or the like that constitutes the controller 15. In addition, the drive part 300 and the switching part 600 may be provided outside the controller 15.

<Modification>

Figure 8:
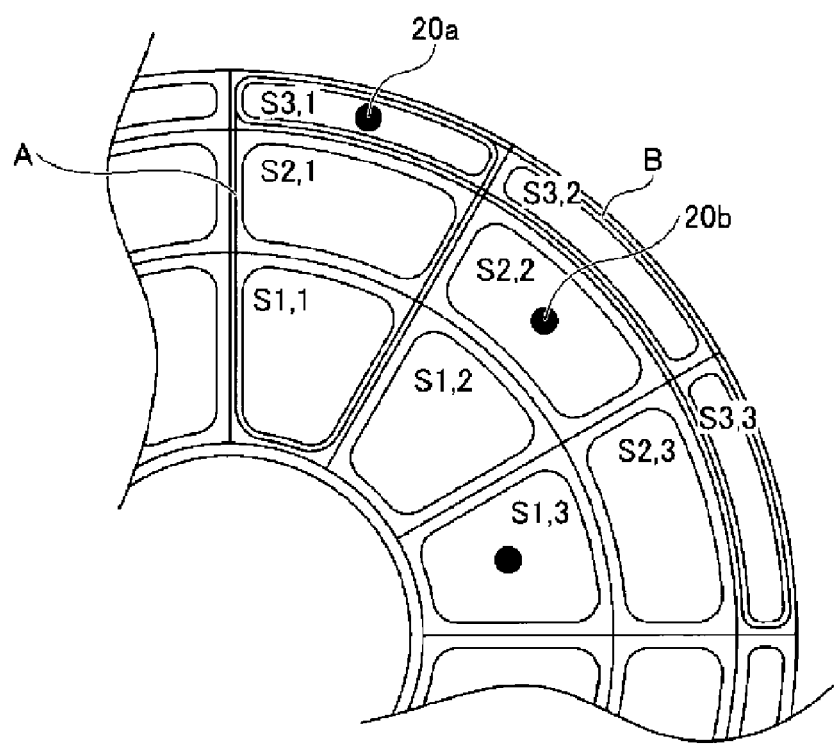
FIG. 8 is a view illustrating an exemplary temperature control state of segments of a first modification of the stage according to the embodiment of the present disclosure.

In the stage according to the embodiment of the present disclosure, the number of individual segments forming the segment sets A and B is 2, but the number is not limited to 2. For example, FIG. 8 is a view illustrating an exemplary temperature control state of segments of a first modification of the stage according to the embodiment of the present disclosure. The number of individual segments forming each segment set may be 3 as illustrated in FIG. 8. Furthermore, the number of individual segments forming each segment set may be 3 or more. That is, the switching part may be configured to switch segment groups.

Figure 9:
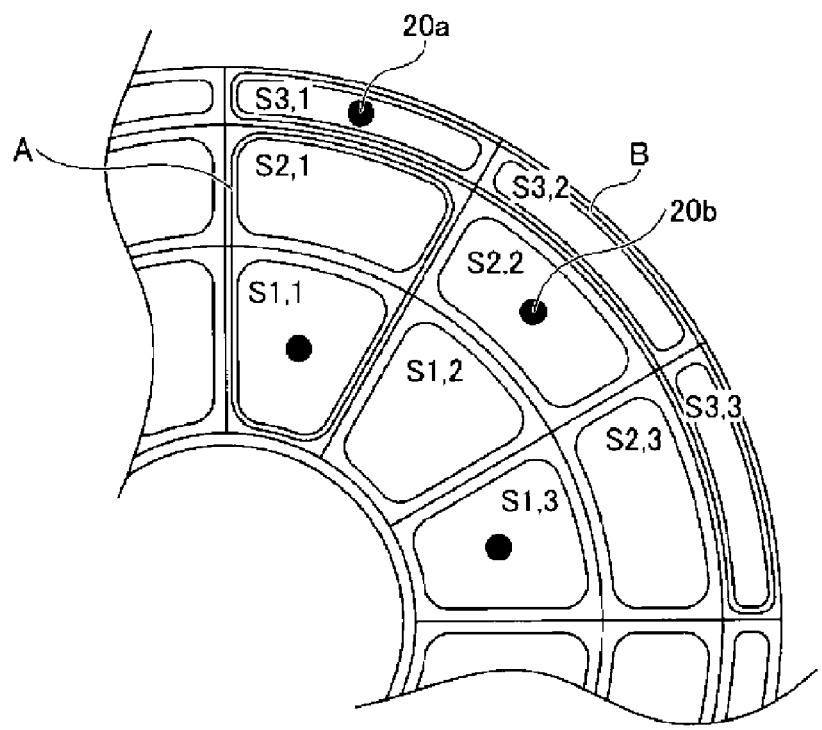
FIG. 9 is a view illustrating an exemplary temperature control state of segments of a second modification of the stage according to the embodiment of the present disclosure.

In the stage according to the embodiment of the present disclosure, the numbers of individual segments forming the segment sets A and B is the same in both segment sets, but the numbers of individual segments in respective segment sets are not limited to the same number. For example, FIG. 9 is a view illustrating an exemplary temperature control state of segments of a second modification of the stage according to the embodiment of the present disclosure. As illustrated in FIG. 9, one segment set may be composed of two individual segments, and the other segment set may be composed of three individual segments. That is, the number of individual segments forming a segment group may be different among the individual segments.

Figure 10:
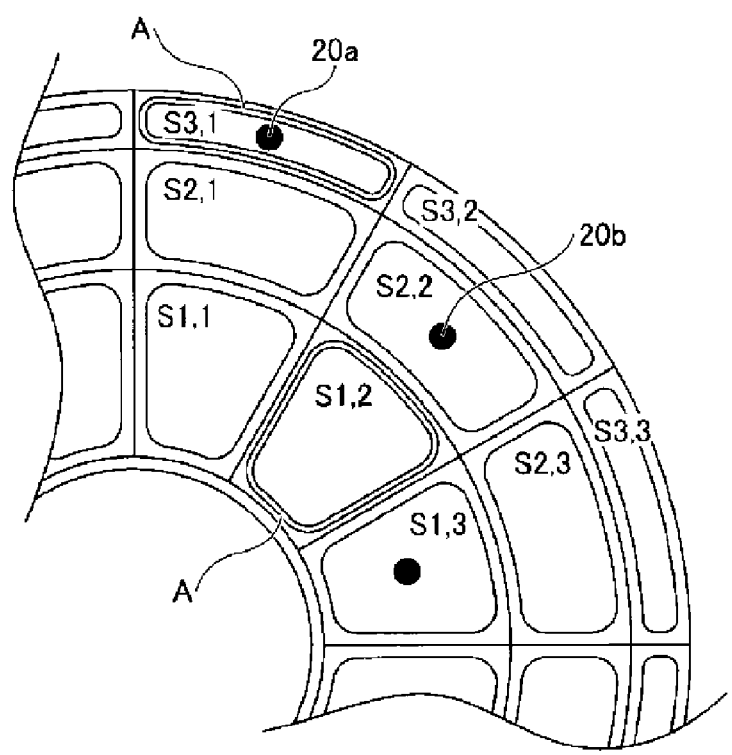
FIG. 10 is a view illustrating an exemplary temperature control state of segments of a third modification of the stage according to the embodiment of the present disclosure.

In the stage according to the embodiment of the present disclosure, the individual segments forming each of the segment sets A and B are adjacent to each other, but the individual segments forming each segment set may not be adjacent to each other. For example, FIG. 10 is a view illustrating an exemplary temperature control state of segments of a third modification of the stage according to the embodiment of the present disclosure. As illustrated in FIG. 10, a segment set may be composed of distant segments.

Regarding the heaters 45 of individual segments in a segment set, the driving power of the heaters 45 may be set to be different for respective individual segments. In addition, when controlling the temperature, a generated temperature distribution may be measured in advance and the temperature distribution may be used for the control. The heater 45 may be driven based on a duty ratio by pulse-width modulated (PWM) signals.

Each segment set is not limited to a set of individual segments including the end of the segment Seg. For example, the segment set may be configured with individual segments near the center of the segment Seg.

According to the present disclosure, it is possible to reduce a calculation load when the temperature of the stage is controlled.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A thermal regulator for controlling temperature of a substantially circular stage comprising a plurality of first segments and a plurality of second segments in a radial direction and in a circumferential direction, each of the first segments and at least two adjacent second segments defining a set of segments, the thermal regulator comprising:
    heaters disposed in the first and second segments, respectively;
    thermal sensors disposed in the first segments, respectively;
    a controller configured to control the heaters in response to temperatures determined by the thermal sensors; and
    a segment switch to switch the second segments to be controlled in conjunction with the first segment in each set of segments,
    wherein the segment switch is configured to perform switching between a second segment adjoining the first segment in the radial direction and another second segment adjoining the first segment in the circumferential direction in each set of segments, and
    wherein the first segments and the second segments are alternately arranged in the radial and circumferential directions.

2. The thermal regulator set forth in claim 1, wherein each set of segments consists of one first segment and two adjacent second segments.

3. The thermal regulator set forth in claim 1, wherein each set of segments consists of one first segment and two adjacent second segments.

4. The thermal regulator set forth in claim 1, wherein each set of segments in the radial or circumferential direction consists of one first segment and two second segments.

5. The thermal regulator set forth in claim 1, wherein each set of segments consists of one first segments and two second segments discrete from the first segment.

6. A substrate processing apparatus comprising:
    a chamber;
    a stage disposed in the chamber; and
    the thermal regulator set forth in claim 1.

7. The thermal regulator set forth in claim 1, wherein the controller is configured to control the heaters with pulse-width modulated (PWM) signals.

8. A thermal regulator for controlling temperature of a stage comprising a plurality of sets of segments, each set of segments comprising a first segment and at least two second segments, the thermal regulator comprising:
    heaters disposed in the first and second segments, respectively, in the plurality of sets of segments;
    thermal sensors disposed in the first segments, respectively, in the plurality of sets of segments;
    a controller configured to control the heaters in response to temperatures determined by the thermal sensors; and
    a segment switch configured to switch the second segments to be controlled in conjunction with the first segment in each set of segments,
    wherein the segment switch is configured to perform switching between a second segment adjoining the first segment in the radial direction and another second segment adjoining the first segment in the circumferential direction in each set of segments, and
    wherein the first segments and the second segments are alternately arranged in the radial and circumferential directions.

9. The thermal regulator set forth in claim 8, wherein the controller is configured to control the heaters with pulse-width modulated (PWM) signals.

10. A method of controlling temperature of a stage comprising a plurality of sets of segments, each set of segments comprising a first segment and at least two second segments, each first segment in the plurality of sets of segments including a heater and a thermal sensor, each second segment in the plurality of sets of segments including a heater, the method comprising:
- controlling the heaters in response to temperatures determined by the thermal sensors; and
- switching the second segments to be controlled in conjunction with the first segment in each set of segments,
- wherein the switching the second segments includes switching between a second segment adjoining the first segment in the radial direction and another second segment adjoining the first segment in the circumferential direction in each set of segments, and
- wherein the first segments and the second segments are alternately arranged in the radial and circumferential directions.

11. The method set forth in claim 10, wherein in the controlling the heaters, the heaters are controlled with pulse-width modulated (PWM) signals.

* * * * *